United States Patent
Jonas et al.

(10) Patent No.: US 8,172,288 B2
(45) Date of Patent: May 8, 2012

(54) GRIPPER, IN PARTICULAR A BERNOULLI GRIPPER

(75) Inventors: Stefan Jonas, Berlin (DE); Lutz Redmann, Kleinmachnow (DE)

(73) Assignee: Jonas & Redmann Automationstechnik GmbH, Berlin (DE)

( * ) Notice: Subject to any disclaimer, the term of this patent is extended or adjusted under 35 U.S.C. 154(b) by 186 days.

(21) Appl. No.: 12/601,664

(22) PCT Filed: May 5, 2008

(86) PCT No.: PCT/DE2008/000789
§ 371 (c)(1),
(2), (4) Date: Dec. 4, 2009

(87) PCT Pub. No.: WO2008/145085
PCT Pub. Date: Dec. 4, 2008

(65) Prior Publication Data
US 2010/0171331 A1    Jul. 8, 2010

(30) Foreign Application Priority Data
May 31, 2007   (DE) .................... 20 2007 007 721 U

(51) Int. Cl.
*A47J 45/00* (2006.01)
(52) U.S. Cl. ...................................... 294/64.3; 294/907
(58) Field of Classification Search ................. 294/64.3, 294/185, 189, 907; 901/40
See application file for complete search history.

(56) References Cited

U.S. PATENT DOCUMENTS

| | | | | |
|---|---|---|---|---|
| 3,523,706 A * | 8/1970 | Logue | ......................... | 294/64.3 |
| 4,852,926 A | 8/1989 | Littell | | |
| 4,969,676 A * | 11/1990 | LaMagna | ..................... | 294/64.3 |
| 5,067,762 A * | 11/1991 | Akashi | ......................... | 294/64.3 |
| 2002/0130524 A1 * | 9/2002 | McIlwraith et al. | ......... | 294/64.3 |
| 2004/0041420 A1 | 3/2004 | Hayes | | |
| 2004/0207219 A1 * | 10/2004 | Schmierer et al. | ........... | 294/64.1 |

FOREIGN PATENT DOCUMENTS

| | | | |
|---|---|---|---|
| EP | 1271623 | | 5/2002 |
| EP | 1271623 A1 * | | 1/2003 |
| EP | 1685930 | | 11/2004 |
| EP | 1685930 A1 * | | 8/2006 |

* cited by examiner

*Primary Examiner* — Saul Rodriguez
*Assistant Examiner* — Gabriela Puig
(74) *Attorney, Agent, or Firm* — Notaro, Michalos & Zaccaria P.C.

(57) ABSTRACT

A gripper for holding two-dimensional components with a low degree of loading, has a clamping ring connected to a controllable robot arm with a baffle plate connected to the clamping ring by a funnel-shaped component and has a gripping face which communicates with a flow system which passes through the funnel-shaped component and the baffle plate. After an excess pressure has been applied to the gripper, a negative pressure is produced on the gripping face in order to attach by suction a wafer to be gripped. A rubberized bearing surface of a bearing ring integrated in the gripping face provides a slip-resistant movement of the wafer. A sensor detects the wafer hat is attached to the gripping face by suction. In order to permit an extremely shock-resistant attachment of the wafer to be gripped on the gripping face of the gripper, a damping device which is circumferentially adapted to the gripper has a contour as viewed in plan that protrudes circumferentially above the contour of the gripper and forms a damping resistance for the wafer.

9 Claims, 4 Drawing Sheets

GRIPPER, IN PARTICULAR A BERNOULLI GRIPPER

CROSS REFERENCE TO RELATED APPLICATIONS

This is a 371 application on International Application PCT/DE2008/000789, filed May 5, 2008, which is incorporated herein by reference and which claims priority on German application 202007007721.1, filed May 31, 2007, which priority claim is repeated here.

The invention relates to a gripper, in particular a Bernoulli gripper for holding in a non-contacting manner two-dimensional components such as silicon-based wafers having a clamping ring connected to a controllable robot arm, having a baffle plate which is connected to the clamping ring by means of a funnel-shaped component and has a gripping face which communicates with a flow system which passes through the funnel-shaped component and the baffle plate and by means of which, after an excess pressure has been applied to the Bernoulli gripper, a negative pressure is to be produced on the gripping face of the baffle plate in order to attach by suction the wafer to be gripped, having a rubberized bearing surface of a bearing ring which rubberized bearing surface is integrated in the gripping face and provides a slip-resistant movement of the wafer attached to the gripping face by suction, and having a sensor for detecting the wafer attached to the gripping face by suction.

It is for example known in automated production of silicon-based wafers that are susceptible to breakage, or of solar cells, for varied handling tasks to use gripper systems comprising grippers that are based on Bernoulli's principle, which grippers by generating negative pressure at the gripping face of the gripper allow individual non-contacting pickup of the wafer in the position at that time. However, the suction-induced non-decelerated impact, on the gripping face of the gripper, of the wafer being gripped has proven to be a source of danger as far as wafer damage is concerned.

SUMMARY OF THE INVENTION

It is thus the object of the present invention to provide a gripper of the type mentioned in the introduction, which gripper, in order to reduce waste, during non-contacting pickup of two-dimensional components such as silicon-based wafers makes possible extremely shock-resistant attachment, at the gripping face of the gripper, of the wafer to be gripped.

According to the invention this object is met by a damping device which is circumferentially adapted to the gripper, the contour of which damping device, when viewed in plan view of the gripper, protrudes circumferentially above the contour of the latter, and which damping device forms such a damping resistance for the wafer to be gripped during its suction-induced approach towards the gripping face that the wafer comes to bear in a shock-free manner against the rubberized bearing surface of the bearing ring.

Preferably, the damping device of the gripper comprises a brush with elastic bristles which bristles, when viewed in lateral view of the gripper, protrude by a defined dimension beyond all the other components of the gripper and in this way as the first contact form a damping resistance for the wafer to be gripped during its suction-induced approach towards the gripping face. The bristle ends opposite the free bristle ends can be attached in a circumferential brush edge which is exchangeably held in a circumferential clamping groove of the gripper, which clamping groove is formed by the clamping ring and the funnel-shaped component.

It is also imaginable to design the damping device of the gripper in the form of a circular foil cutout made of plastic, with elastic lamellae that extend radially inwards from the circumference of said foil cutout and are separated from each other by slots that provide the required damping during the suction-induced approach of the two-dimensional component to be gripped. Equivalent embodiments are also possible.

Preferably, in plan view of the gripper, the contour of the gripping face of the baffle plate and the circumference of the brush are circular, and the baffle plate and the brush are arranged so as to be coaxial to the axis of the gripper. Furthermore, the elastic bristles of the brush, in plan view of the gripper, can form an open ring of approximately 340°, wherein the bristle-free annular section of the brush is spatially associated with a capacitive sensor for detecting the wafer that is attached by suction. It is also possible for the bristles of the brush to extend so as to be downwards inclined at an angle of $16.5°\pm1°$ relative to the plane of the gripping face of the baffle plate, wherein the predetermined dimension beyond which the elastic bristles of the brush, viewed in lateral view of the gripper, protrude beyond all the other components of the gripper, ranges from 1.5 mm to 3.5 mm. Preferably, the elastic bristles of the brush comprise polyamide.

The gripper according to the invention ensures that in each case the wafer to be attached by suction first establishes contact with the elastic bristles of the brush, and thus, in a manner of speaking, in the suction-induced approach to the gripping face of the gripper is gently damped in a mechanical manner before it comes to bear in a shock-resistant manner against the rubberized bearing surface of the bearing ring. In this arrangement it is immaterial whether or not the two-dimensional component is aligned parallel to the rubberized bearing surface; instead, in each case, the danger, during handling, of damaging the wafers that are susceptible to damage is reduced, and waste is thus considerably reduced. The rubberized bearing surface ensures the friction between the wafer to be gripped and the gripping surface of the gripper, which friction is necessary for rapid lateral movement.

Preferably, the damping device of the gripper, which damping device is circumferentially adapted to the gripper and protrudes circumferentially above the contour of the gripper, can also be an integrated sealing-like rubber ring from a suitable elastic material that is very soft, by means of which rubber ring the wafer in its suction-induced bearing against the rubberized bearing surface of the bearing ring, which bearing surface is integrated in the gripping face, is circumferentially hermetically sealed from the baffle plate through which the flow system passes. In this embodiment operation of the Bernoulli gripper needs to be switched over to vacuum operation immediately after suction-induced placement of the wafer against the rubberized bearing surface by switching a vacuum pump that is connected to an air connection of the flow system over to vacuum operation, while at the same time a second air connection of the flow system is switched off, which second air connection, for the purpose of generating the pressure differential for attaching the wafer by suction, was impinged upon by air. When the Bernoulli gripper attaches the wafer by suction the sealing-ring-like rubber ring contracts, thus forming a complete sealing circle with the wafer. Within the sealing circle a vacuum can form and consequently the wafer is pushed against the rubberized bearing surface by external atmospheric pressure, and is thus held in a slip-resistant manner. In this manner the air consumption can be reduced considerably while still achieving reliable holding of the wafer against the rubberized bearing surface of the bearing ring.

BRIEF DESCRIPTION OF THE DRAWINGS

Below, a preferred embodiment of the gripper according to the invention is now described with reference to the drawings. The following are shown.

DESCRIPTION OF THE PREFERRED EMBODIMENT

Figure 1:
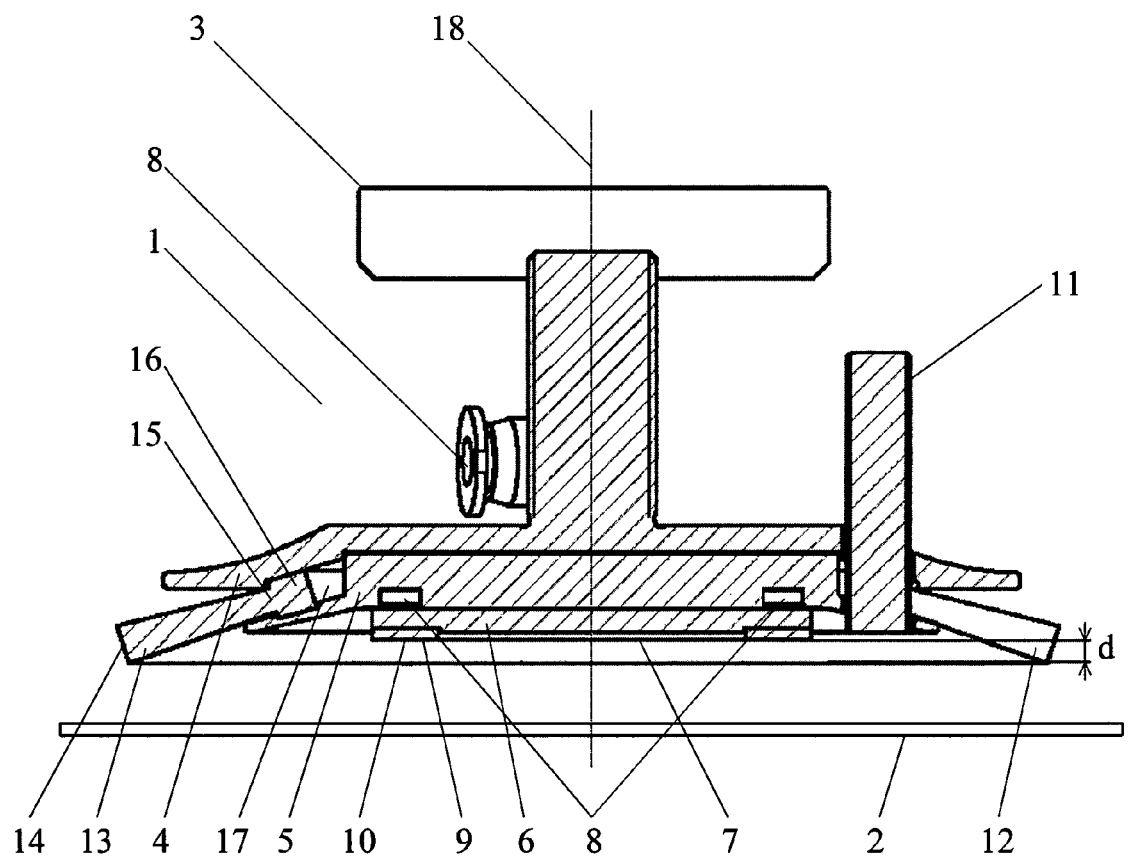
FIG. 1 a lateral section view of a diagrammatically illustrated Bernoulli gripper associated with a wafer to be gripped.
Figure 2:
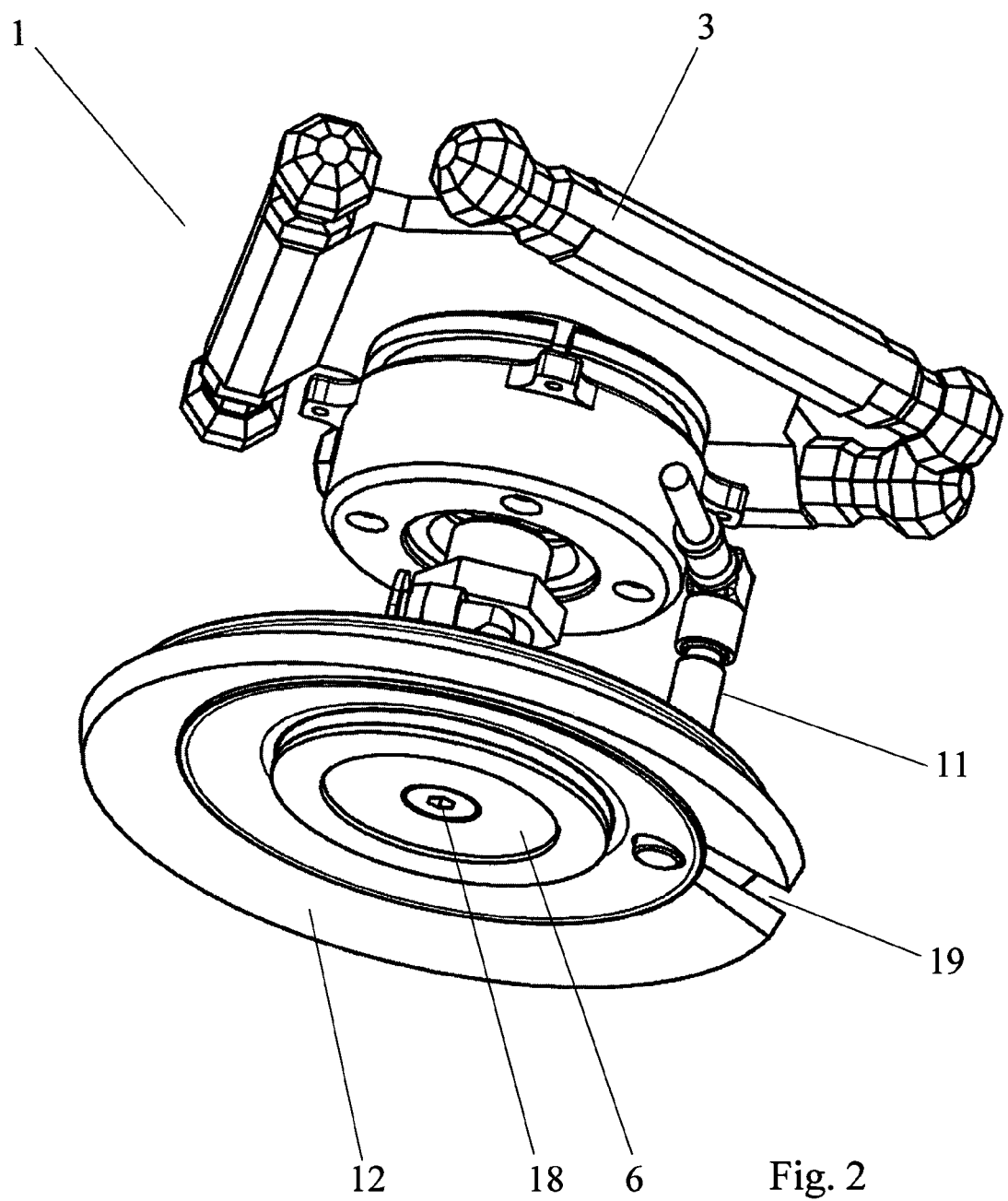
FIG. 2 a perspective bottom view of the Bernoulli gripper without the wafer to be gripped.
Figure 3:
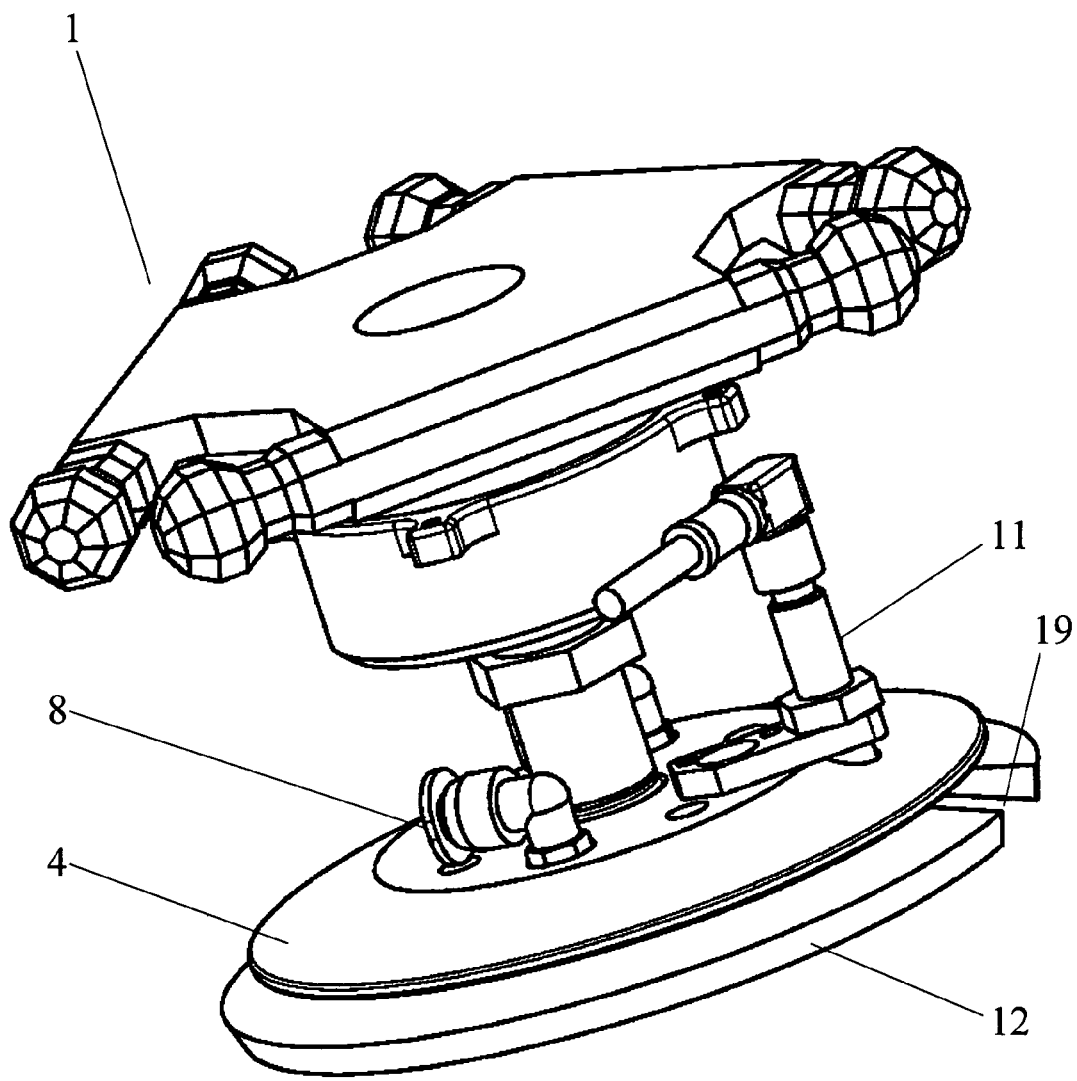
FIG. 3 a perspective top view of the Bernoulli gripper without the wafer to be gripped.

As shown in FIGS. 1 to 3, for non-contacting holding of two-dimensional components such as silicon-based wafers 2 the Bernoulli gripper 1 essentially comprises a clamping ring 4 that is connected to at least one controllable robot arm 3, a baffle plate 6 which is connected to the clamping ring 4 by way of a funnel-shaped component 5 and comprises a gripping face 7 in which a rubberized bearing surface 9 of a bearing ring 10 is integrated, a flow system 8 which flows through the funnel-shaped component 5 and the baffle plate 6, which flow system 8 communicates with the gripping face 7 of the gripper 1, a damping device 12, which is circumferentially adapted to the gripper 1, with the damping device 12 being in the form of a brush with elastic bristles and a capacitive sensor 11 to detect a wafer 2 held by the gripper 1.

If an excess pressure has been applied to the Bernoulli gripper 1, due to the pressure differential formed, a negative pressure is produced on the gripping face 7 of the baffle plate 6 in order to attach by suction the wafer 2 to be gripped. Since, as is most clearly shown in FIG. 1, the baffle plate 6 and the brush 12 that forms the damping device are arranged so as to be coaxial to the longitudinal axis 18 of the gripper 1, and the circumferential contour of the brush, viewed in plan view of the gripper 1, protrudes circumferentially above the contour of the latter and thus the circular gripping face 7 of the baffle plate 6, in each case the wafer 2 to be attached by suction, during the suction-induced approach to the gripping face 7, first establishes contact with the elastic bristles 13 of the brush 12 which bristles 13, when viewed in lateral view of the gripper 1, protrude beyond the clamping ring 4, the funnel-shaped component 5 and the baffle plate 6 of the gripper 1 by a dimension ranging from 1.5 mm to 3.5 mm. The bristles 13 of the brush 12, which bristles 13 according to FIG. 1 can extend so as to be downwards inclined at an angle of 16.5°±1° relative to the plane of the gripping face 7 of the baffle plate 6, exert such a damping resistance on the suction-induced approach of the wafer 2 that the wafer 2 comes to bear in a shock-free manner against the rubberized bearing surface 9 of the bearing ring 10. The susceptibility of the wafer 2 to breakage is thus in a mechanical and at the same time energy-saving manner reduced to a significant extent.

As is further shown in FIG. 1, the bristle ends 14 opposite the free bristle ends 15 are attached in a circumferential brush edge 16 which is exchangeably held in a circumferential clamping groove 17 of the gripper 1, which clamping groove 17 is formed by the clamping ring 4 and the funnel-shaped component 5. Exchanging the damping device according to the area size of the wafer 2 to be gripped is thus possible in a suitable manner if required.

FIGS. 2 and 3 show that in the illustrated embodiment of the gripper 1 the elastic bristles 13 of the brush 12, in plan view of the gripper 1, form an open ring of approximately 340°, wherein the bristle-free annular section 19 of the brush 12 is spatially associated with the capacitive sensor 11 for detecting the wafer 2 that is attached by suction.

Figure 4:
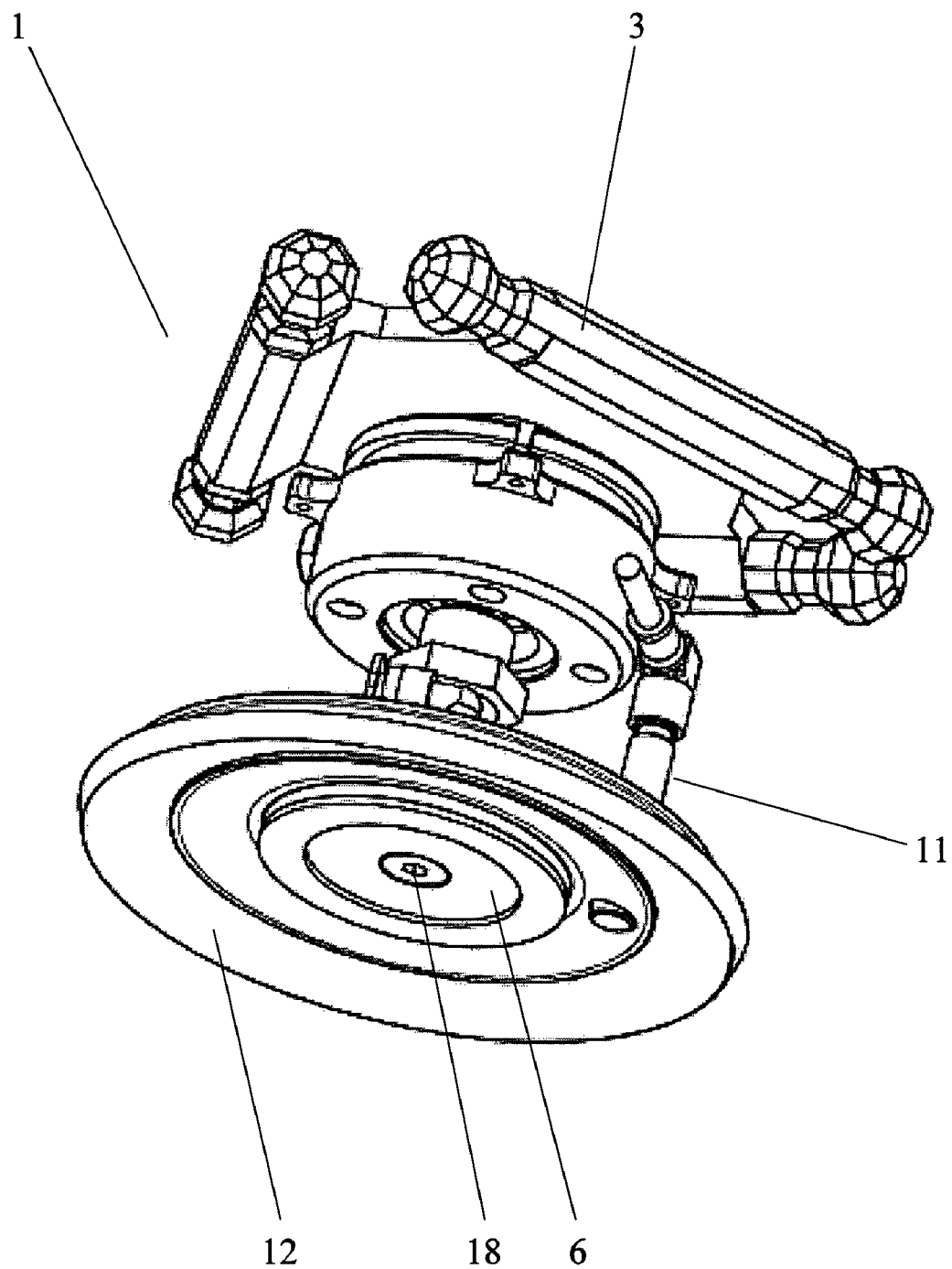
FIG. 4 a perspective view, which corresponds to that in FIG. 2, of the Bernoulli gripper, wherein the damping device of the gripper is, however, formed by an integrated rubber ring.

According to FIG. 4, the damping device 12 of the gripper 1, which damping device is circumferentially adapted to the gripper 1 and protrudes circumferentially above the contour of the gripper 1, is an integrated sealing-ring-like rubber ring from a suitable elastic material that is very soft, by means of which rubber ring the wafer 2 in its suction-induced bearing against the rubberized bearing surface 9 of the bearing ring 10, which bearing surface 9 is integrated in the gripping face 7, is circumferentially hermetically sealed from the baffle plate through which the flow system 8 passes. Operation of the Bernoulli gripper 1 needs to be switched over to vacuum operation immediately after suction-induced placement of the wafer 2 against the rubberized bearing surface 9 of the bearing ring 10 by switching a vacuum pump that is connected to an air connection of the flow system 8 over to vacuum operation, while at the same time a second air connection of the flow system 8 is switched off, which second air connection, for the purpose of generating the pressure differential for attaching the wafer 2 by suction, was impinged upon by air. When the Bernoulli gripper 1 attaches the wafer 2 by suction the sealing-ring-like rubber ring 12 contracts, thus forming a complete sealing circle with the wafer 2. Within the sealing circle a vacuum can form and consequently the wafer 2 is pushed against the rubberized bearing surface 9 by atmospheric pressure, and is thus held in a slip-resistant manner. In this manner the air consumption is reduced considerably while still achieving reliable holding of the wafer 2 against the rubberized bearing surface 9 of the bearing ring 10.

LIST OF REFERENCE CHARACTERS

1 Gripper, Bernoulli gripper
2 Two-dimensional component, silicon-based wafer
3 Robot arm
4 Clamping ring
5 Funnel-shaped component
6 Baffle plate
7 Gripping face
8 Flow system
9 Rubberized bearing surface
10 Bearing ring
11 Sensor
12 Damping device, brush, rubber ring
13 Bristles
14 Free bristle ends
15 Attached bristle ends
16 Brush edge
17 Clamping groove
18 Longitudinal axis of the gripper
19 Bristle-free annular section of the brush
d Defined dimension

The invention claimed is:

1. A gripper (1) for holding two-dimensional components, comprising: a clamping ring (4) connected to a controllable robot arm (3), a baffle plate (6) connected to the clamping ring (4) by a funnel-shaped component (5) having a gripping face (7) which communicates with a flow system (8) which passes through the funnel-shaped component (5) and the baffle plate (6) and by means of which, after an excess pressure has been applied to the gripper (1), a negative pressure is produced on the gripping face (7) of the baffle plate (6) in order to attach by suction a two-dimensional component to be gripped, a bearing ring (10) having a bearing surface (9) which is integrated in the gripping face (7) and provides a slip-resistant movement of the two-dimensional component attached to the gripping face (7) by suction, and having a damping device (12) which is circumferentially adapted to the gripper (1), the contour of which damping device (12), when viewed in plan view of the gripper (1), protrudes circumferentially above the contour of all the other components (4, 5, 6) of the gripper (1), and which damping device (12) forms such a damping resistance for the two-dimensional component to be gripped during its suction-induced approach towards the gripping face (7) that the two-dimensional component comes to bear in a shock-free manner against the bearing surface (9) of the bearing ring (10), and wherein:

the bearing surface (9) of the bearing ring (10) is rubberized; and the damping device (12) which is circumferentially adapted to the gripper (1) comprises a brush (12) with elastic bristles (13) which, when viewed in lateral view of the gripper (1), protrude by a dimension (d) which ranges from 1.5 mm to 3.5 mm beyond all the other components (4, 5, 6) of the gripper (1) and as the first contact form a damping resistance for the wafer (2) to be gripped during its suction-induced approach towards the gripping face (7).

2. The gripper according to claim 1, characterised in that the bristle ends (15) opposite the free bristle ends (14) are attached in a circumferential brush edge (16) which is exchangeably held in a circumferential clamping groove (17) of the gripper (1), which clamping groove (17) is formed by the clamping ring (4) and the funnel-shaped component (5).

3. The gripper according to claim 1, characterised in that, in plan view of the gripper (1), the contour of the gripping face (7) of the baffle plate (6) and the circumference of the brush (12) are circular, and the baffle plate (6) and the brush (12) are arranged so as to be coaxial to the longitudinal axis (18) of the gripper (1).

4. The gripper according to claim 1, characterised in that the elastic bristles (13) of the brush (12), in plan view of the gripper (1), form an open ring of approximately 340°, wherein the bristle-free annular section (19) of the brush (12) is spatially (2) associated with a capacitive sensor (11) for detecting the wafer (2) that is attached by suction.

5. The gripper according to claim 1, characterised in that the bristles (13) of the brush (12) extend so as to be downwards inclined at an angle of 16.5°±1° relative to the plane of the gripping face (7) of the baffle plate (6).

6. The gripper according to claim 1, characterised in that the elastic bristles (13) of the brush (12) comprise polyamide.

7. The gripper according to claim 1, characterised in that the gripper is a Bernoulli gripper (1) for holding two-dimensional components comprising silicon based wafer (2).

8. A gripper (1) for holding two-dimensional components, comprising: a clamping ring (4) connected to a controllable robot arm (3), a baffle plate (6) connected to the clamping ring (4) by a funnel-shaped component (5) having a gripping face (7) which communicates with a flow system (8) which passes through the funnel-shaped component (5) and the baffle plate (6) and by means of which, after an excess pressure has been applied to the gripper (1), a negative pressure is to be produced on the gripping face (7) of the baffle plate (6) in order to attach by suction the two-dimensional component to be gripped, having a bearing surface (9) of a bearing ring (10) which is integrated in the gripping face (7) and provides a slip-resistant movement of the two-dimensional component attached to the gripping face (7) by suction, and having a damping device (12) which is circumferentially adapted to the gripper (1), the contour of which damping device (12), when viewed in plan view of the gripper (1), protrudes circumferentially above the contour of all the other components (4, 5, 6) of the gripper (1), and which damping device (12) forms such a damping resistance for the two-dimensional component to be gripped during its suction-induced approach towards the gripping face (7) that the wafer (2) comes to bear in a shock-free manner against the bearing surface (9) of the bearing ring (10), and wherein:

the bearing surface (9) of the bearing ring (10) is rubberized;

the damping device (12) of the gripper (1), which damping device (12) is circumferentially adapted to the gripper (1), comprises an integrated sealing-like rubber ring from a soft material, by means of which rubber ring the two-dimensional component in its suction-induced bearing against the rubberized bearing surface (9) of the bearing ring (10), which bearing surface (9) is integrated in the gripping face (7), is circumferentially hermetically sealed from the baffle plate (6) through which the flow system (8) passes; and on the gripper (1) a capacitive sensor (11) for detecting the wafer (2) that is attached by suction to the gripping face (7) is provided.

9. The gripper according to claim 8, characterised in that the gripper is a Bernoulli gripper (1) for holding two-dimensional components comprising silicon based wafers (2).

* * * * *